United States Patent
Zhu et al.

(10) Patent No.: US 8,039,096 B2
(45) Date of Patent: Oct. 18, 2011

(54) FRICTION- AND WEAR-REDUCING COATING

(75) Inventors: Dong Zhu, Farmington Hills, MI (US); Robert Milner, Warren, MI (US); Alaa AbdelAzim Elmoursi, Troy, MI (US)

(73) Assignee: Eaton Corporation, Cleveland, OH (US)

( * ) Notice: Subject to any disclaimer, the term of this patent is extended or adjusted under 35 U.S.C. 154(b) by 200 days.

(21) Appl. No.: 12/493,713

(22) Filed: Jun. 29, 2009

(65) Prior Publication Data
US 2010/0028641 A1 Feb. 4, 2010

Related U.S. Application Data

(60) Provisional application No. 61/133,491, filed on Jun. 30, 2008.

(51) Int. Cl.
- B32B 5/14 (2006.01)
- B32B 5/00 (2006.01)
- B05D 3/00 (2006.01)
- B05D 3/10 (2006.01)
- C23C 14/34 (2006.01)

(52) U.S. Cl. ........ 428/220; 428/332; 427/299; 427/307; 204/192.11

(58) Field of Classification Search .......... 428/220, 428/332; 427/299, 307; 204/192.11
See application file for complete search history.

(56) References Cited

U.S. PATENT DOCUMENTS

| | | | |
|---|---|---|---|
| 6,099,605 | A | 8/2000 | Cook et al. |
| 6,228,471 | B1 | 5/2001 | Neerinck et al. |
| 6,432,855 | B1 | 8/2002 | Cook et al. |
| 6,607,782 | B1 | 8/2003 | Malshe et al. |
| 6,921,422 | B2 | 7/2005 | Cook et al. |
| 7,172,641 | B2 | 2/2007 | Cook et al. |
| 7,238,429 | B2 | 7/2007 | Cook et al. |
| 7,375,343 | B1 | 5/2008 | Cook et al. |
| 7,517,375 | B2 | 4/2009 | Cook et al. |
| 2003/0219605 | A1* | 11/2003 | Molian et al. ............. 428/422 |
| 2005/0123686 | A1 | 6/2005 | Myrick |
| 2005/0275143 | A1 | 12/2005 | Toth |
| 2006/0134424 | A1 | 6/2006 | Plissonnier |
| 2008/0226897 | A1 | 9/2008 | Can et al. |

FOREIGN PATENT DOCUMENTS

EP 1657323 A1 * 5/2006
(Continued)

OTHER PUBLICATIONS

Mohamed El Ashmawy and Hubertus Murrenhoff, "Experimental Investigation of Friction Force Between Vane Tip and Cam-ring in Oil Vane Pumps", International Journal of Fluid Power, Mar. 2009, pp. 37-46, vol. 10, No. 1.

(Continued)

*Primary Examiner* — David Sample
*Assistant Examiner* — Tahseen N Khan
(74) *Attorney, Agent, or Firm* — Quinn Law Group, PLLC

(57) ABSTRACT

A coating includes a first layer of a ceramic alloy and a second layer disposed on the first layer and including carbon. The coating has a hardness of from 10 to 20 GPa and a coefficient of friction of less than or equal to 0.12. A method of coating a substrate includes cleaning the substrate, forming the first layer on the substrate, and depositing the second layer onto the first layer to thereby coat the substrate.

15 Claims, 2 Drawing Sheets

FOREIGN PATENT DOCUMENTS

| | | | |
|---|---|---|---|
| EP | 1884978 A1 | * | 2/2008 |
| WO | 03/068503 A1 | | 8/2003 |
| WO | 2006125683 A1 | | 11/2006 |
| WO | WO 2006125683 A1 | * | 11/2006 |

OTHER PUBLICATIONS

I. G. Goryachev, "Contact Mechanics in Tribology", 1998, pp. 191-197, Kluewer, Codrecht.

H. C. Meng and K. C. Ludema, "Wear models and predictive equations: their form and content", Journal: Wear, 1995, pp. 443-457, vols. 181-183.

B. A. Cook, J. L. Harringa, T. L. Lewis, A. M. Russell, "A new class of ultra-hard material based on AlMgB14", Scripta Materilia, 2000, pp. 597-602, vol. 42.

A. Ahmed, S. Bahadur, B. A. Cook, J. Peters, "Mechanical properties and scratch test studies of new ultra-hard AlMgB14 modified by TiB2", Tribology International, 2006, pp. 129-137, vol. 39.

Y. Tian, A. F. Bastawros, C. C. H. Lo, A. P. Constant, A. M. Russell, B. A. Cook, "Superhard self-lubricating AlMgB14 films for microelectromechanical devices", Applied Physics Letters 2003, pp. 2781-2783, vol. 83, No. 14.

J. A. Heimberg, K. J. Wahl, I. L. Singer, A. Erdemir, "Superlow friction behavior of diamond-like carbon coatings: Time and speed effects", Journal: Applied Physics Letters, 2001, pp. 2449-2451, vol. 78, No. 17.

D. G. Teer, "New solid lubricant coatings", Journal: Wear, 2001, pp. 1068-1074, vol. 251, Issues 1-12.

* cited by examiner

FRICTION- AND WEAR-REDUCING COATING

CROSS-REFERENCE TO RELATED APPLICATIONS

This application claims the benefit of U.S. Provisional Application 61/133,491, filed on Jun. 30, 2008, which is hereby incorporated by reference in its entirety.

STATEMENT REGARDING FEDERALLY SPONSORED RESEARCH OR DEVELOPMENT

The invention described herein was made in the course of research under Department of Energy Grant No. DE-FG36-06GO16054. The federal government may have certain rights in the invention.

TECHNICAL FIELD

The invention relates to friction-reducing coatings.

BACKGROUND OF THE INVENTION

Devices with movable components may experience degradation, efficiency losses, and shortened service life due to component wear. For example, engine components and energy conversion devices such as hydraulic pumps and hydraulic motors often include gears, bearings, and other movable components which translate and/or rotate with respect to a countersurface. After many operation cycles, friction between such movable components and the countersurface may cause degradation, i.e., wear, of the movable component.

Harder components generally experience less wear than comparatively softer components. Therefore, to minimize wear, a wear-reducing coating having an increased hardness, such as TiN, TiAlN, and CrN, may be applied to the movable components. However, such increased hardness may in turn damage the countersurface. That is, the increased hardness may actually increase friction between the movable component and the countersurface because of micro-cutting and abrasive three-body wear, and consequently degrade the countersurface. To compensate for such friction, a friction-reducing coating such as diamond-like carbon, rather than a wear-reducing coating, may be applied to the movable components. However, such friction-reducing coatings often suffer from decreased hardness and the aforementioned shortcomings.

SUMMARY OF THE INVENTION

A coating includes a first layer of a ceramic alloy and a second layer disposed on the first layer. The second layer includes carbon. The coating has a hardness of from 10 to 20 GPa and a coefficient of friction of less than or equal to 0.12.

In one embodiment, the coating includes the first layer of a ceramic alloy represented by the general formula $AlMgB_{14}$—X, wherein X is present in an amount of from 0 to 70 parts by weight based on 100 parts by weight of the ceramic alloy and is a doping agent selected from the group of Group IV elements and borides and nitrides thereof. Further, the second layer includes carbon present in a gradient concentration that increases with a distance from the first layer.

A method of coating a substrate includes cleaning the substrate, forming the first layer of a ceramic alloy on the substrate, and depositing the second layer including carbon onto the first layer to thereby coat the substrate.

The coating exhibits excellent tribological properties and performance. In particular, the coating reduces friction and wear between components. That is, the coating exhibits excellent hardness and anti-wear performance, but is also suitable for applications requiring a minimal coefficient of friction. The coating also mitigates any valleys, pockets, and/or voids in a substrate or between layers of the coating to provide a smooth surface. Therefore, the coating minimizes micro-cutting and abrasion at an interface between components and consequently minimizes friction between such components. Further, the coating exhibits excellent hardness. Therefore, the coating provides excellent wear resistance for components and devices requiring durability and reliability. Finally, the coating exhibits excellent thermal resistance and does not substantially degrade at a temperature of less than or equal to 1,000° C.

The above features and advantages and other features and advantages of the present invention are readily apparent from the following detailed description of the best modes for carrying out the invention when taken in connection with the accompanying drawings.

DETAILED DESCRIPTION OF THE EMBODIMENTS

Figure 1:
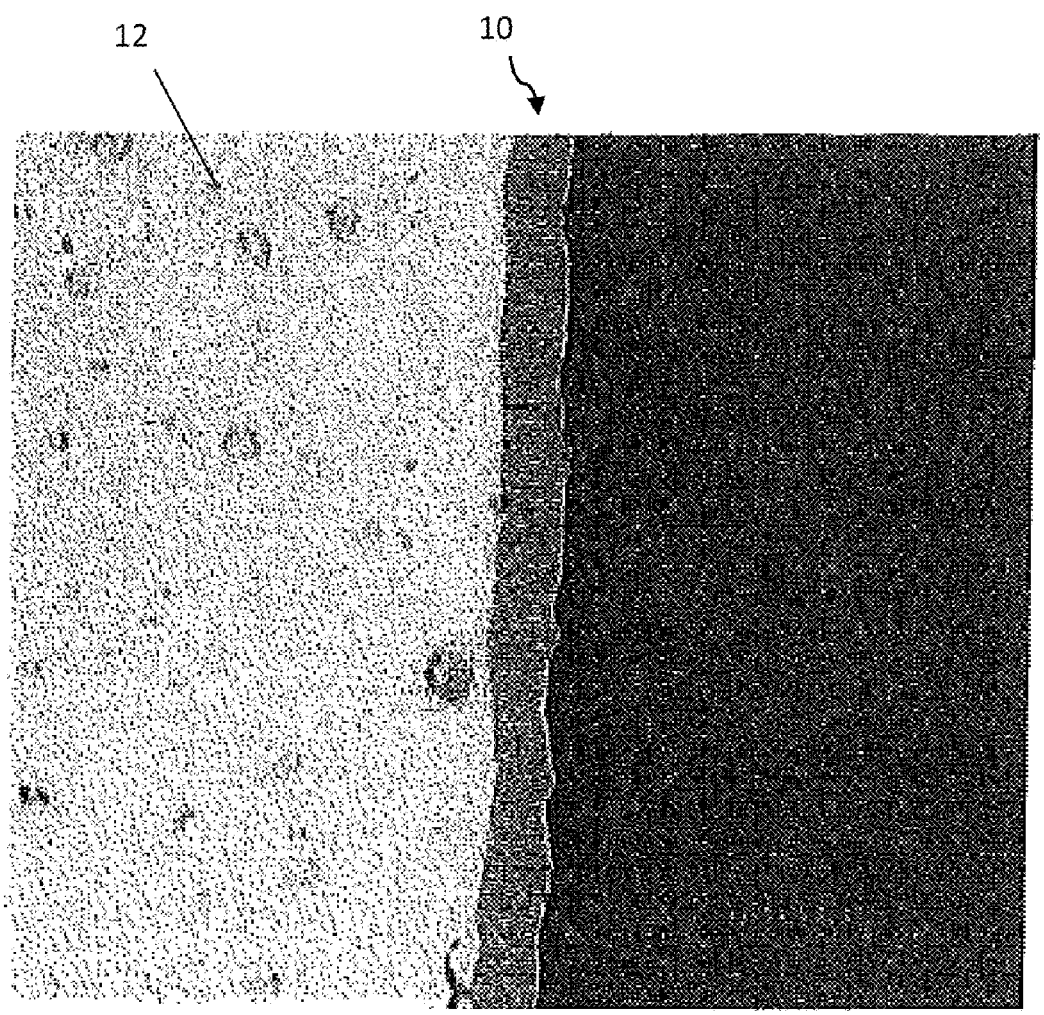
FIG. 1 is a reproduction of a scanning electron microscope photomicrograph of a prior art coating.

Referring to the drawings, wherein like reference numerals refer to like components, a prior art coating 10 is shown disposed on a substrate 12 in FIG. 1. In contrast, a coating of the present invention is shown generally at 14 in FIG. 2. The coating 14 and a method of coating the substrate 12 are disclosed herein. As compared to the prior art coating 10 of FIG. 1, the coating 14 and method of the present invention may be useful for reducing friction and wear between two surfaces. For example, the coating 14 and method may be useful for applications including engine components and devices configured for converting energy, such as, but not limited to, hydraulic pumps and hydraulic motors. That is, the coating 14 may be useful for, for example, vane pumps, axial piston pumps, and/or valve-in-star motors. However, it is to be appreciated that the coating 14 and method can have applications beyond applications requiring reduced friction and wear, such as for applications requiring excellent coating hardness.

Figure 2:
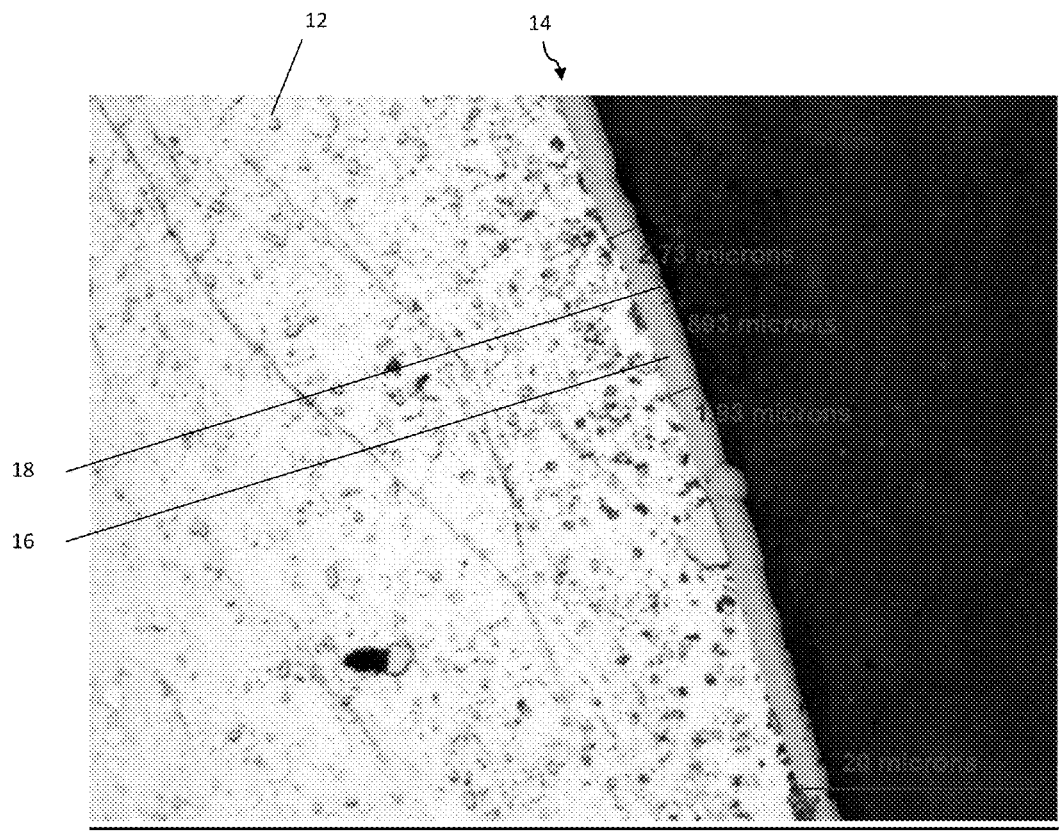
FIG. 2 is a reproduction of a scanning electron microscope photomicrograph of a coating of the present invention including a first layer and a second layer and disposed on a substrate.

Referring to FIG. 2, the coating 14 includes a first layer 16 of a ceramic alloy. The first layer 16 generally provides the coating 14 with excellent hardness and wear-resistance. As such, the ceramic alloy may be any ceramic alloy that exhibits excellent hardness and wear resistance. The ceramic alloy may be an orthorhombic boride-based alloy. For example, the ceramic alloy may be an aluminum magnesium boride alloy and may be represented by the general formula $AlMgB_{14}$—X, wherein X is present in an amount of from 0 to 70 parts by weight based on 100 parts by weight of the ceramic alloy and is a doping agent selected from the group of Group IV elements and borides and nitrides thereof. That is, the ceramic alloy may be doped with elements such as, but not limited to, titanium and zirconium, and borides and nitrides thereof. The doping agent may be selected to increase the hardness of the ceramic alloy. A suitable specific example of X is $TiB_2$.

Therefore, in one example wherein X is not present in the ceramic alloy, i.e., X is present in an amount of 0 parts by weight, the ceramic alloy may be $Al_{0.75}Mg_{0.78}B_{14}$, commonly referred to as $AlMgB_{14}$. The ceramic alloy may also be a mixture of $AlMgB_{14}$ and one or more other aluminum magnesium boride compounds. In another example wherein X is present in the ceramic alloy in an amount greater than 0 parts by weight, the ceramic alloy may be $AlMgB_{14}$—$TiB_2$. That is, the ceramic alloy may be single phase, e.g., $AlMgB_{14}$, or multi-phase, e.g., $AlMgB_{14}$—$TiB_2$.

The ceramic alloy may be further described as a nanocomposite. As used herein, the terminology nanocomposite is used to represent a solid composite material having a phase dimension of less than 100 nm. Suitable examples of a ceramic alloy are commercially available under the trade name CTNC 3003 or CTNC 3004 from New Tech Ceramics of Des Moines, Iowa.

The first layer 16 may have a hardness of from 30 to 40 GPa. Further, the first layer 16 may have a thickness of from 0.5 to 4 microns. For example, the first layer 16 may have a thickness of from 1 to 3 microns.

Referring to FIG. 2, the coating 14 also includes a second layer 18 disposed on the first layer 16. The second layer 18 generally provides the coating, with excellent lubricity. That is, the second layer 18 may function as a solid lubricant and provide the coating 14 with an excellent coefficient of friction, as set forth in more detail below.

The second layer 18 includes carbon. In particular, the second layer 18 may include amorphous carbon, i.e., an allotrope of carbon that does not have a crystalline structure. The carbon may be present in the second layer 18 in a gradient concentration that increases with a distance from the first layer 16. That is, the gradient concentration of carbon may be selected depending on the lubricity, coefficient of friction, and wear-resistance requirements of the coating 14. The second layer 18 may be deposited onto the first layer 16, as set forth in more detail below, so that a concentration of carbon in the second layer 18 increases over a range of from about 1 part by weight to 90 parts by weight based on 100 parts by weight of the second layer 18. For example, at or near an interface between the first layer 16 and the second layer 18 of the coating 14, the concentration of carbon may be about 30 parts by weight based on 100 parts by weight of the second layer 18. And, as the distance from the first layer 16 increases, the concentration of carbon may gradually increase to about 50 parts by weight. Finally, at a distal edge of the second layer 18, the concentration of carbon may reach, for example, 90 parts by weight based on 100 parts by weight of the second layer 18.

In another example, the concentration of carbon may increase sharply from the interface of the first layer 16 and the second layer 18 to the distal edge of the second layer 18. Alternatively, the concentration of carbon may increase only slightly from the interface to the distal edge. It is to be appreciated that the concentration of carbon may also be substantially the same throughout the second layer 18.

For applications where the gradient concentration of carbon in the second layer 18 is less than 100 parts by weight, it is to be appreciated that the ceramic alloy of the first layer 16 is the other component present in the second layer 18. That is, the second layer 18 may be disposed on the first layer 16 so as to gradually transition between the ceramic alloy of the first layer 16 and the carbon of the second layer 18.

Without intending to be limited by theory, the second layer 18 may fill any valleys, pockets, and/or voids of the first layer 16 to smooth the peaks and provide excellent lubricity to the coating 14. Referring to FIG. 1, existing wear-reducing coatings 10 often include such peaks and/or valleys, pockets, and voids. Likewise, the first layer 16 of the coating 14 may include microscopic peaks and/or valleys, pockets, and voids that contribute to the excellent hardness and wear-resistance of the first layer 16, but also may contribute to an unacceptable coefficient of friction of the first layer 16. Therefore, the second layer 18 may smooth such peaks and valleys to provide the coating 14 with excellent lubricity.

The second layer 18 may have a thickness that is less than or equal to 50% of a thickness of the first layer 16. That is, the first layer 16 may be comparatively thicker than the second layer 18. Specifically, the second layer 18 may have a thickness of from 0.1 to 1.5 microns. In one example, the second layer 18 may have a thickness of from 0.2 to 1 micron. Further, the second layer 18 may have a hardness of from 10 to 25 GPa.

Additionally, the coating 14 may further include a plurality of first layers 16 and a plurality of second layers 18. That is, in one example, the coating 14 may include alternating first and second layers 16, 18, as long as at least one second layer 18 is disposed on at least one first layer 16.

The method of coating the substrate 12 includes cleaning the substrate 12. The substrate 12 may be, for example, formed from metal, and the substrate 12 is cleaned to prepare the substrate 12 to accept the coating 14. More specifically, cleaning the substrate 12 generally removes dirt, grease, flash rust, and/or surface oxidation. The substrate 12 may be any suitable metal such as, but not limited to, M2 tool steel, A2 tool steel, 52100 steel, 8620 steel, and aluminum. Further, the substrate 12 may be, for example, a surface of a component of an engine or a device configured for converting energy.

Cleaning may include washing the substrate 12 in a solvent, such as acetone, to remove any surface contaminants. Cleaning the substrate 12 may also include soaking the substrate 12 in an ultrasonic cleaning solution heated to a temperature of from about 100 to 150° C. for approximately 10 minutes. Next, the substrate 12 may be rinsed in water at ambient temperature for approximately 5 minutes and in deionized water at ambient temperature for from 5 to 10 minutes. The substrate 12 may then be air dried via compressed air. The substrate 12 may again be rinsed in a solvent, such as acetone. Then, the substrate 12 may be heated in an enclosed chamber to a temperature of from 38 to 65° C. for at least 1 hour. To ensure proper cleaning, a visual inspection of the substrate 12 may be performed after the substrate 12 is removed from the enclosed chamber.

For some substrates 12, the method may also include heating the substrate 12 prior to cleaning. Heating the substrate 12 prior to cleaning enables degassing of the substrate 12. For example, for applications including a cemented tungsten carbide substrate 12, the substrate 12 may be heated in the chamber to from 300 to 400° C. for at least 15 minutes. In one example, the substrate 12 may be heated to about 350° C. for about 45 minutes. During heating, the pressure of the chamber may be held below 2 mPa.

Cleaning may further be defined as etching the substrate 12. In particular, the substrate 12 may be cleaned via radio frequency (RF) etching in a vacuum to prepare the substrate 12 to accept the coating 14. The substrate 12 may be etched in a vacuum chamber at a temperature of from 100 to 300° C. The etching temperature is generally selected according to a composition of the material of the substrate 12. For example, for ferrous substrates that may experience tempering at elevated coating temperatures, etching may be performed at about 150° C. An inert gas such as argon or krypton may be selected to purge the atmosphere in the chamber and etch the substrate 12. Partial pressure of the chamber may be from 100 to 300 mPa, e.g., about 200 mPa, during etching. Etching may occur at an applied power of from 800 to 1,600 W, e.g., about 1,200 W. Depending upon a complexity of the shape of the substrate 12, the substrate 12 may be etched for from approximately 0.5 to 3 hours, e.g., for from 1 to 2 hours. However, longer etching times may be also be suitable. Again, to ensure proper cleaning, a visual inspection of the substrate 12 may be performed after the substrate 12 is etched to ensure that no arcing has occurred.

The method also includes forming the first layer 16 of the ceramic alloy on the substrate 12. That is, the first layer 16 is formed on the substrate 12 in preparation for the second layer 18, as set forth in more detail below. Depending upon the material of the substrate 12, a bond layer may also exist between the substrate 12 and the first layer 16. For example, the bond layer may include chromium or chromium nitride and may assist in bonding the first layer 16 to the substrate 12.

In particular, forming may be further defined as physical vapor depositing the first layer 16 on the substrate 12. Any suitable physical vapor deposition technique may be used to form the first layer 16. For example, unbalanced magnetron sputtering, arc evaporation, electron beam (EB) evaporation, and pulsed laser deposition may be used to form the first layer 16.

More specifically, physical vapor depositing may be further defined as sputtering the substrate 12 with a target material represented by the general formula $AlMgB_{14}$—X, wherein X is defined as set forth above. As used herein, the terminology sputtering is used to represent a technique of removing atomized material from a solid via energetic bombardment of the material by ions or neutral particles. In a typical sputtering process, an inert gas such as argon or krypton is introduced into a chamber to induce a gaseous plasma under a vacuum. Depending upon the temperature sensitivity of the first layer 16, sputtering may occur at a temperature of from 100 to 300° C. at a partial pressure of from 300 to 600 mPa for from 1 to 5 hours. Further, sputtering may occur at a power of from 1,000 to 3,000 W, e.g., 1,200 W, so that thermal stresses and/or cracking of the target material may be minimized. During sputtering, ions from a gaseous plasma are accelerated to bombard the target. The target is eroded by the ions via energy transfer and ejects neutral and charged particles such as individual or clustered atoms or molecules. The ejected neutral and charged particles then contact the substrate 12 and form a film, i.e., the first layer 16, on the substrate 12. A suitable physical vapor deposition unit is commercially available under the trade name CC800®/8 from CemeCon of Würselen, Germany.

The method also includes depositing the second layer 18 including carbon onto the first layer 16 to thereby coat the substrate 12. Depositing may be further defined as increasing a concentration of carbon in the second layer 18 with a distance from the first layer 16 so that carbon is present in the second layer 18 in a gradient concentration. That is, the concentration of carbon in the second layer 18 may increase with increasing distance from the first layer 16. Therefore, the concentration of carbon at a distal edge of the second layer 18 may be larger than the concentration of carbon at the interface between the first layer 16 and the second layer 18. For applications requiring excellent lubricity, such as a substrate 12 for surface break-in, the concentration of carbon may reach 90% at the distal edge of the second layer 18.

In one example, depositing may be further defined as sputtering the first layer 16 with a target material including carbon. That is, as the solid target including carbon is bombarded by energized ions, carbon atoms are expelled from the carbon target and deposit the second layer 18. To effect such deposition, one or more carbon targets may be installed in the chamber with the one or more $AlMgB_{14}$—X targets. After the first layer 16 is formed to the desired thickness as set forth above, power supplied to the $AlMgB_{14}$—X targets is gradually reduced while power supplied to the carbon targets is gradually increased. As a result, the second layer 18 is deposited on the formed first layer 16 to form the coating 14. Stated differently, a composition of the coating 14 gradually changes from substantially pure $AlMgB_{14}$—X to substantially carbon to form the first layer 16 and second layer 18, respectively, i.e., the coating 14 on the substrate 12. Therefore, the desired thickness of the second layer 18 may be controlled by adjusting power supplied to the carbon targets over time.

In another example, depositing may be further defined as decomposing a carbon-based gas in the presence of the first layer 16. Suitable carbon-based gases include, but are not limited to, acetylene and methane. In this example, the carbon-based gas is introduced into the chamber to deposit the second layer 18. A growth of the second layer 18 may be controlled by the carbon-based gas flow rate. After the first layer 16 is formed to the desired thickness as set forth above, power to the $AlMgB_{14}$—X targets is gradually decreased as the carbon-based gas is introduced into the chamber at a gradually increasing flow rate. For example, the flow rate of the carbon-based gas may be increased from 10 to 150 ml/min, e.g., from 10 to 125 ml/min or from 10 to 100 ml/min, over time. That is, the flow rate may be increased from about 0.5 ml/40 seconds to about 0.5 ml/20 seconds to about 0.5 ml/8 seconds. As the flow rate of the carbon-based gas increases, the power supplied to the $AlMgB_{14}$—X targets may be simultaneously decreased to from 1,500 to 100 W. Generally, depositing may occur at a temperature of less than or equal to 200° C. without any external heating source.

Due to an inert gas enriched-plasma environment in the chamber and a negative bias voltage applied to the substrate 12, the carbon-based gas decomposes so that amorphous carbon is deposited on top of the first layer 16. Stated differently, since the power supplied to the $AlMgB_{14}$—X targets is gradually reduced and a concentration of the carbon-based gas in the chamber is gradually increased, a composition of the coating 14 gradually changes from substantially pure $AlMgB_{14}$—X to substantially carbon to form the first layer 16 and second layer 18, respectively, i.e., the coating 14 on the substrate 12.

The resulting coating 14 exhibits excellent tribological properties and performance. That is, the coating 14 has a hardness of from 10 to 20 GPa and a coefficient of friction of less than or equal to 0.12. Therefore, the coating 14 is unexpectedly useful for simultaneously reducing friction and wear between surfaces and/or components. More specifically, the coating 14 exhibits excellent hardness and anti-wear performance, and is suitable for components requiring a minimal coefficient of friction. Further, as compared to existing wear-reducing coatings, the coating 14 mitigates any valleys, pockets, and/or voids to provide a smooth surface. Therefore, the coating 14 minimizes micro-cutting and abrasion at an interface between components and consequently minimizes friction between such components.

Further, as compared to existing friction-reducing coatings 10, the coating 14 exhibits excellent hardness. Therefore, the coating 14 provides excellent wear resistance for components and devices requiring durability and reliability. In particular, the coating 14 may have a wear rate of less than or equal to $2 \times 10^{-7}$ mm$^3$/N·m as measured in accordance with ASTM G99-05.

Additionally, the coating 14 exhibits excellent thermal resistance and may not substantially degrade at a temperature of less than or equal to 1,000° C. That is, the coating 14 may not substantially degrade, e.g., melt, chip, wear, gouge, or pit, at a temperature of less than or equal to 1,000° C. Stated differently, the coating 14 may not substantially chemically or physically degrade under such operating conditions. Therefore, the coating 14 may be useful for applications requiring operating temperatures of from 400 to 1,000° C. Further, the coating 14 contributes to an excellent hydraulic fluid film for devices configured for converting energy.

The following examples are meant to illustrate the invention and are not to be viewed in any way as limiting to the scope of the invention.

EXAMPLES

Example 1

In preparation for coating an M2 steel substrate with a coating of Example 1, the M2 steel substrate, two $AlMgB_{14}$ targets, and two solid carbon targets are placed into a chamber of a CemeCon CC008®/8 physical vapor deposition unit supplied with argon gas. Heating elements within the chamber are supplied with approximately 2,000 W to heat the M2 steel substrate to approximately 300° C. for 1 hour. During heating, pressure within the chamber is maintained at 8 mPa.

In preparation for etching the M2 steel substrate, the chamber is supplied with radio frequency power at 1,200 W for 1 hour. The M2 steel substrate is etched with argon gas having a flow rate of 75 ml/min. During etching, pressure within the chamber is maintained at 250 mPa.

To form a first layer of the coating on the M2 steel substrate, the two $AlMgB_{14}$ targets are supplied with 1,500 W of power. During forming, argon gas is supplied to the chamber at a flow rate of 250 ml/min. The resulting first layer is formed at a rate of about 0.6 microns/hour.

To deposit a second layer on the first layer and thereby form the coating of Example 1, the two carbon targets are supplied with power increasing from 100 to 2,000 W as power supplied to the two $AlMgB_{14}$ targets is ramped down from 1,500 to 100 W. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Example 1.

Example 2

In preparation for coating an M2 steel substrate with a coating of Example 2, the M2 steel substrate and four $AlMgB_{14}$ targets are placed into the chamber of the CemeCon CC008®/8 physical vapor deposition unit supplied with separate streams of argon and acetylene gas. Heating elements within the chamber are supplied with approximately 2,000 W of power to heat the M2 steel substrate to approximately 300° C. for 1 hour. During heating, pressure within the chamber is maintained at 8 mPa.

In preparation for etching the M2 steel substrate, the chamber is supplied with radio frequency power at 1,200 W for 1 hour. The M2 steel substrate is etched with argon gas having a flow rate of 75 ml/min. During etching, pressure within the chamber is maintained at 250 mPa.

To form a first layer of the coating on the M2 steel substrate, the four $AlMgB_{14}$ targets are supplied with 1,500 W of power. During forming, argon gas is supplied to the chamber at a flow rate of 250 ml/min. The resulting first layer is formed at a rate of about 1.0 microns/hour.

To deposit a second layer on the first layer and thereby form the coating of Example 2, the power supplied to the four $AlMgB_{14}$ targets is ramped down from 1,500 to 100 W as acetylene gas is introduced to the chamber at a gradually increasing flow rate over the range of 10 to 125 ml/min. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Example 2.

Example 3

In preparation for coating an M2 steel substrate with a coating of Example 3, the M2 steel substrate, two $AlMgB_{14}$—$TiB_2$ targets, and two solid carbon targets are placed into the chamber of the CemeCon CC008®/8 physical vapor deposition unit supplied with argon gas. Heating elements within the chamber are supplied with approximately 2,000 W to heat the M2 steel substrate to approximately 300° C. for 1 hour. During heating, pressure within the chamber is maintained at 8 mPa.

In preparation for etching the M2 steel substrate, the chamber is supplied with radio frequency power at 1,200 W for 1 hour. The M2 steel substrate is etched with argon gas having a flow rate of 75 ml/min. During etching, pressure within the chamber is maintained at 250 mPa.

To form a first layer of the coating on the M2 steel substrate, the two $AlMgB_{14}$—$TiB_2$ targets are supplied with 1,500 W of power. During forming, argon gas is supplied to the chamber at a flow rate of 250 ml/min. The resulting first layer is formed at a rate of about 0.6 microns/hour.

To deposit a second layer on the first layer and thereby form the coating of Example 3, the two carbon targets are supplied with increasing power of from 100 to 2,000 W as power supplied to the two $AlMgB_{14}$—$TiB_2$ targets is ramped down from 1,500 to 100 W. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Example 3.

Example 4

In preparation for coating an M2 steel substrate with a coating of Example 4, the M2 steel substrate and four $AlMgB_{14}$—$TiB_2$ targets are placed into the chamber of the CemeCon CC008®/8 physical vapor deposition unit supplied with separate streams of argon and acetylene gas. Heating elements within the chamber are supplied with approximately 2,000 W to heat the M2 steel substrate to approximately 300° C. for 1 hour. During heating, pressure within the chamber is maintained at 8 mPa.

In preparation for etching the M2 steel substrate, the chamber is supplied with radio frequency power at 1,200 W for 1 hour. The M2 steel substrate is etched with argon gas having a flow rate of 75 ml/min. During etching, pressure within the chamber is maintained at 250 mPa.

To form a first layer of the coating on the M2 steel substrate, the four $AlMgB_{14}$—$TiB_2$ targets are supplied with 1,500 W of power. During forming, argon gas is supplied to the chamber at a flow rate of 250 ml/min. The resulting first layer is formed at a rate of about 1.0 microns/hour.

To deposit a second layer on the first layer and thereby form the coating of Example 4, the power supplied to the four $AlMgB_{14}$—$TiB_2$ targets is ramped down from 1,500 to 100 W as acetylene gas is introduced to the chamber at a gradually increasing flow rate over the range of 10 to 125 ml/min. During deposition, argon gas is supplied to the chamber at a flow rate of 250 ml/min. The resulting second layer including carbon is deposited on the first layer in a gradient concentration ranging from 30 to 90 parts by weight of carbon based on 100 parts by weight of the second layer to form the coating of Example 4.

Comparative Example 5

In preparation for coating an M2 steel substrate with a coating of Comparative Example 5, the M2 steel substrate and four $AlMgB_{14}$ targets are placed into the chamber of the CemeCon CC008®/8 physical vapor deposition unit supplied with argon gas. Heating elements within the chamber are supplied with approximately 2,000 W of power to heat the M2 steel substrate to approximately 300° C. for 1 hour. During heating, pressure within the chamber is maintained at 8 mPa.

In preparation for etching the M2 steel substrate, the chamber is supplied with radio frequency power at 1,200 W for 1 hour. The M2 steel substrate is etched with argon gas having a flow rate of 75 ml/min. During etching, pressure within the chamber is maintained at 250 mPa.

To form the coating of Comparative Example 5 on the M2 steel substrate, the four $AlMgB_{14}$ targets are supplied with 1,500 W of power. During forming, argon gas is supplied to the chamber at a flow rate of 250 ml/min. The resulting coating of Comparative Example 5 is formed at a rate of about 1.0 microns/hour.

Comparative Example 6

In preparation for coating an M2 steel substrate with a coating of Comparative Example 6, the M2 steel substrate and four $AlMgB_{14}$—$TiB_2$ targets are placed into the chamber of the CemeCon CC008®/8 physical vapor deposition unit supplied with argon gas. Heating elements within the chamber are supplied with approximately 2,000 W to heat the M2 steel substrate to approximately 300° C. for 1 hour. During heating, pressure within the chamber is maintained at 8 mPa.

In preparation for etching the M2 steel substrate, the chamber is supplied with radio frequency power of 1,200 W for 1 hour. The M2 steel substrate is etched with argon gas having a flow rate of 75 ml/min. During etching, pressure within the chamber is maintained at 250 mPa.

To form the coating of Comparative Example 6 on the M2 steel substrate, the four $AlMgB_{14}$—$TiB_2$ targets are supplied with 1,500 W of power. During forming, argon gas is supplied to the chamber at a flow rate of 250 ml/min. The resulting coating of Comparative Example 6 is formed at a rate of about 1.0 microns/hour.

The M2 steel substrates coated with the coatings of Examples 1-4 and Comparative Examples 5-6 are subjected to operating conditions of a vane pump and visually inspected for wear. In particular, six vane pumps, including M2 steel vanes coated with each of the coatings of Examples 1-4 and Comparative Examples 5-6, respectively, are operated at 1,800 rpm in Mobil DTE 24 oil at a temperature of 80° C. and a pressure of 2,500 psi for 250 hours. The vanes are also evaluated after operation at 3,000 psi for 4 hours. The vanes are then visually inspected for wear and rated as acceptable or unacceptable.

Additionally, a coefficient of friction of the coatings is measured using a pin-on-disk test. More specifically, a pin having a tip radius of 4.7625 mm under a load of 60.33 N is rotated at a speed of 0.9 m/s for a distance of 1,000 m along a round disk sample of each of the coated M2 steel substrates. A wear rate is also calculated for the coatings of Examples 3-4 and Comparative Example 6 based on operation of the vane pumps in Houghto-Safe® 419-R water glycol hydraulic fluid, commercially available from Houghton International Inc. of Valley Forge, Pa. Finally, the coatings of Examples 1-4 and Comparative Examples 5-6 are measured for hardness according to the Knoop hardness test. The results of each of the aforementioned tests are summarized below in Table 1.

TABLE 1

| Coating | Coating Summary | Hardness (GPa) | Acceptable Wear? | Coating Degradation? | Coefficient of Friction | Wear Rate (mm³/N · m) |
| --- | --- | --- | --- | --- | --- | --- |
| Ex. 1 | $AlMgB_{14}$ + C (sputter) | 10-20 | Yes | No | $\leq 0.12$ | — |
| Ex. 2 | $AlMgB_{14}$ + C (gas) | 10-20 | Yes | No | $\leq 0.12$ | — |
| Ex. 3 | $AlMgB_{14}$—$TiB_2$ + C (sputter) | 10-20 | Yes | No | $\leq 0.12$ | $\leq 2 \times 10^{-7}$ |
| Ex. 4 | $AlMgB_{14}$—$TiB_2$ + C (gas) | 10-20 | Yes | No | $\leq 0.12$ | $\leq 2 \times 10^{-7}$ |
| Comp. Ex. 5 | $AlMgB_{14}$ | 17-34 | No | Yes | 0.13-0.18 | — |
| Comp. Ex. 6 | $AlMgB_{14}$—$TiB_2$ | 13-30 | No | Yes | 0.08-0.14 | $\leq 1 \times 10^{-7}$ |

As evidenced by the above comparative data, the coatings of Examples 1-4 exhibit excellent tribological properties and performance. Specifically, the coatings of Examples 1-4 exhibit excellent hardness and coefficients of friction, and are therefore useful for applications requiring coatings that reduce both friction and wear.

In particular, the coatings of Examples 1-4 have a coefficient of friction that is less than or equal to 0.12. By comparison, the coatings of Comparative Examples 5-6 have a coefficient of friction that may be greater than 0.12. Therefore, the coatings of Examples 1-4 reduce friction between surfaces.

Further, the coatings of Examples 1-4 exhibit excellent hardness and anti-wear performance. In particular, the coatings of Examples 1-4 have a hardness of from 10-20 GPa, while having a coefficient of friction that is less than or equal to 0.12. By comparison, the coatings of Comparative Examples 5-6 have a higher hardness and a higher coefficient of friction. Similarly, the coatings of Examples 3 and 4 have a wear rate of less than or equal to $2 \times 10^{-7}$ mm³/N·m, while having a coefficient of friction that is less than or equal to 0.12. By comparison, the coating of Comparative Example 6 has a higher coefficient of friction and a lower wear rate. Therefore, the coatings of Examples 1-4 are more suitable for applications requiring coatings that reduce both friction and wear as compared to the coatings of Comparative Examples 5-6.

Further, as compared to the coatings of Comparative Examples 5-6, the coatings of Examples 1-4 mitigate any valleys, pockets, and/or voids in the coatings to provide a smooth surface. Therefore, the coatings of Examples 1-4 minimize micro-cutting and abrasion at an interface between surfaces and consequently minimize both friction and wear between such surfaces.

Finally, as compared to the coatings of Comparative Examples 5-6, the coatings of Examples 1-4 exhibit excellent thermal resistance and may not substantially degrade at a temperature of less than or equal to 1,000° C. The coatings of Examples 1-4 also contribute to an excellent hydraulic fluid film for devices configured for converting energy.

While the best modes for carrying out the invention have been described in detail, those familiar with the art to which this invention relates will recognize various alternative designs and embodiments for practicing the invention within the scope of the appended claims.

The invention claimed is:

1. A coating comprising:
    a first layer of a ceramic orthorhombic boride-based alloy represented by the general formula $AlMgB_{14}$—X and having a thickness of from greater than 1 micron to less than or equal to 3 microns;
    wherein X is present in an amount of from 0 to 70 parts by weight based on 100 parts by weight of said ceramic orthorhombic boride-based alloy and is a doping agent selected from the group of Group IV elements and borides and nitrides thereof; and
    a second layer disposed on said first layer and including amorphous carbon present in a gradient concentration that increases with a distance from said first layer;
    wherein the coating has a hardness of from 10 to 20 GPa;
    wherein the coating has a coefficient of friction of less than or equal to 0.12.

2. The coating of claim 1, wherein said first layer has a hardness of from 30 to 40 GPa.

3. The coating of claim 1, wherein said second layer has a hardness of from 10 to 25 GPa.

4. The coating of claim 1, wherein said coating does not substantially degrade at a temperature of less than or equal to 1,000° C.

5. The coating of claim 4, wherein said coating has a wear rate of less than or equal to $2 \times 10^{-7}$ mm$^3$/N·m as measured in accordance with ASTM G99-05.

6. A coating comprising:
    a first layer of a ceramic orthorhombic based-boride alloy represented by the general formula $AlMgB_{14}$—X and having a thickness of from 1.25 to 3 microns;
    wherein X is present in an amount of from 0 to 70 parts by weight based on 100 parts by weight of said ceramic orthorhombic boride-based alloy and is a doping agent selected from the group of Group IV elements and borides and nitrides thereof; and
    a second layer disposed on said first layer and including amorphous carbon present in a gradient concentration that increases with a distance from said first layer and having a thickness of from 0.1 to 1.5 microns;
    wherein the coating has a hardness of from 10 to 20 GPa;
    wherein the coating has a coefficient of friction of less than or equal to 0.12.

7. The coating of claim 6, wherein said first layer has a hardness of from 30 to 40 GPa.

8. The coating of claim 7, wherein said second layer has a hardness of from 10 to 25 GPa.

9. A method of coating a substrate, the method comprising the steps of:
    cleaning the substrate;
    forming a first layer of a ceramic orthorhombic boride-based alloy represented by the general formula $AlMgB_{14}$—X and having a thickness of greater than 1 micron to less than or equal to 3 microns on the substrate;
    wherein X is present in an amount of from 0 to 70 parts by weight based on 100 parts by weight of the ceramic orthorhombic boride-based alloy and is a doping agent selected from the group of Group IV elements and borides and nitrides thereof; and
    depositing a second layer onto the first layer to form a coating on the substrate, wherein the second layer includes amorphous carbon present in a gradient concentration that increases with a distance from the first layer;
    wherein the coating has a hardness of from 10 to 20 GPa;
    wherein the coating has a coefficient of friction of less than or equal to 0.12.

10. The method of claim 9, wherein said depositing is further defined as increasing a concentration of amorphous carbon in the second layer with a distance from the first layer so that amorphous carbon is present in the second layer in the gradient concentration.

11. The method of claim 9, wherein said depositing is further defined as sputtering the first layer with a target material including carbon.

12. The method of claim 9, wherein said depositing is further defined as decomposing a carbon-based gas in the presence of the first layer.

13. The method of claim 9, wherein said cleaning is further defined as etching the substrate.

14. The method of claim 9, wherein said forming is further defined as physical vapor depositing the first layer.

15. The method of claim 14, wherein said physical vapor depositing is further defined as sputtering the substrate with a target material represented by the general formula $AlMgB_{14}$—X;
    wherein X is present in an amount of from 0 to 70 parts by weight based on 100 parts by weight of the ceramic orthorhombic boride-based alloy and is a doping agent selected from the group of Group IV elements and borides and nitrides thereof.

* * * * *